United States Patent [19]

Barth, Jr. et al.

[11] Patent Number: 4,999,815

[45] Date of Patent: Mar. 12, 1991

[54] LOW POWER ADDRESSING SYSTEMS

[75] Inventors: John E. Barth, Jr., South Burlington; Charles E. Drake, Underhill, both of Vt.; William P. Hovis, Rochester, Minn.; Howard L. Kalter, Colchester, Vt.; Gordon A. Kelley, Jr., Essex Junction, Vt.; Scott C. Lewis, Essex Junction, Vt.; Daniel J. Nickel, Westford, Vt.; James A. Yankosky, Essex Junction, Vt.

[73] Assignee: International Business Machines Corporation, Armonk, N.Y.

[21] Appl. No.: 479,137

[22] Filed: Feb. 13, 1990

[51] Int. Cl.⁵ .............................................. G11C 11/40
[52] U.S. Cl. ............................ 365/230.06; 365/230.01
[58] Field of Search ....................... 365/230.01, 230.06, 365/189.01, 189.05

[56] References Cited

U.S. PATENT DOCUMENTS 4,763,302  8/1988  Yamada ................................. 365/189
4,831,597  5/1989  Fuse ..................................... 365/233

Primary Examiner—Terrell W. Fears
Attorney, Agent, or Firm—Stephen J. Limanek

[57] ABSTRACT

Low power addressing systems are provided which include a given number of memory segments, each having word and bit/sense lines, a given number of decoders coupled to the given number of memory segments for selecting one word line in each of the memory segments, a first plurality of transmission gate systems, each having first and second transmission gates, with each of the gates being coupled to a different one of the decoders, a second decoder having the first plurality of outputs, each of the outputs being coupled to a respective one of the transmission gate systems, first control circuits for selectively activating the first and second gates in each of the first plurality of transmission gate systems, a second given number of decoders coupled to the given number of memory segments for selecting one bit/sense line in each of the memory segments, a second plurality of transmission gate systems, each having first and second transmission gates, with each of the gates of the second plurality of transmission gate systems being coupled to a different one of the second given number of decoders, and second control circuits for selectively activating the first and second gates of each of the second plurality of transmission gate systems.

13 Claims, 5 Drawing Sheets

LOW POWER ADDRESSING SYSTEMS

TECHNICAL FIELD

This invention relates to low power addressing systems for semiconductor integrated circuits and, more particularly, to systems which use a plurality of modules, each of which have at least one chip therein with a high density of cells, preferably wherein the systems include modules each having a memory chip with a high density dynamic random access memory (DRAM) of, e.g., 16 million cells or more per chip.

BACKGROUND ART

As integrated semiconductor circuits, such as dynamic random access memory cells, increase in density in a semiconductor chip, the active power used in a chip containing the memory also increases. A number of different methods have been tried or proposed to minimize the use of active power, i.e., the power used during the writing or reading of memory cells, e.g., by the use of precharged bit line voltages having magnitudes of one half of the chip power supply voltage, known as ½ Vdd or ½ Vcc, and/or by segmenting the array powered during active cycles, i.e., during the memory reading or writing cycles. Such methods have found acceptance in that they have been able to limit the active power to within the range of about 300 to 400 milliwatts. However, with the density of memory cells on a chip increasing to sixteen million or more, the space required on the chip for necessary multiplexed addresses is not adequate to limit the active power in the desired or acceptable range without segmenting the memory array to a point wherein there results a loss of density.

In order to limit the active power in memories using chips with sixteen million or more cells or bits of stored information, it has been proposed to alter the addressing of the memory chips by using a 12/10 addressing technique rather than the usual 11/11 addressing technique, i.e., to multiplex in twelve addresses during row enable (RE) or row address strobe (RAS) time and to multiplex in ten addresses during the column enable (CE) or column address strobe (CAS) time rather than to multiplex in eleven addresses during the RE time and eleven addresses during the CE time. The 12/10 addressing technique has been found to lower the active power without sacrificing chip density. However, it should be noted that although the 12/10 addressing technique reduces active power, it does require a memory cell refresh rate of 4,000 addresses instead of 2,000 addresses or double the refresh power generally needed to maintain the contents of the memory cells valid. As an example, a standard 16 megabit DRAM using the 11/11 addressing technique has 2,000 refresh cycles every 32 millisecond for an average of 15.7 microseconds between refresh cycles providing a memory availability of 99.3%, whereas a standard 16 megabit DRAM using the 12/10 addressing technique requires 4,000 refresh cycles which lowers the memory availability to 98.7%.

It should also be noted that for smaller systems, i.e., for systems which do not have a large amount of memory, the increase in refresh power is insignificant due to the fact that the majority of the memory chips are frequently active, but they do experience a loss of availability when the 4,000 refresh cycles are required. In memory systems that incorporate battery backup or low power mode, the increase in, i.e., doubling, the refresh power consequently increases the demand on such a power system. In large systems, i.e., wherein many memory chips are provided, the memory is used in banks with only a few chips active at any given time, with the remainder of the memory in standby. With a majority of the chips in standby, the refresh power increase has a major impact on the memory system, particularly to the card which supports modules containing the memories. Another method for alleviating this power problem is to increase, e.g., double, the memory cell retention time by either taking a yield loss or by improving the semiconductor integrated circuit technology, which at present is very expensive.

In U.S. Pat. No 4,831,597, filed on Nov. 9, 1987, by T. Fuse, there is disclosed a memory system wherein bit lines of the memory are selected at a first timing by a row address signal and word lines are selected at a second timing following the first timing by a column address signal of multiplex address signals.

U S. Pat. No. 4,763,302, filed on Apr. 22, 1986, by T. Yamada, discloses a memory system wherein the cells of the array of the memory system can be accessed according to two addressing configurations.

DISCLOSURE OF THE INVENTION

It is an object of this invention to provide a low power addressing system by designing a semiconductor memory chip so that it can be operated on a common card by either the 11/11 addressing technique using 2,000 refresh cycles or the 12/10 addressing technique using 4,000 refresh cycles. With column enable (CE) before row enable (RE) pulsing as a 2,000 refresh, the user may obtain the benefit of both the low active power of the 12/10 addressing technique, as well as the low refresh power of the 11/11 addressing technique. Moreover, cell availability increases using the CE before RE pulse refresh, while also allowing migratability from existing chip designs that need to remain with the 11/11 addressing technique.

In accordance with the teachings of this invention, a low power addressing system is provided which includes a given plurality of memory segments, each having word and bit/sense lines, a given plurality of decoders coupled to the given plurality of memory segments for selecting one word line in each of the memory segments, a first plurality of transmission gate systems, each having first and second gates, with each of the gates being coupled to a different one of the decoders, a second decoder having the first plurality of outputs, each of the outputs being coupled to a respective one of the transmission gate systems, means for selectively activating the first and second gates in each of the first plurality of transmission gate systems, a second plurality of decoders equal in number to the given plurality of decoders coupled to the given plurality of memory segments for selecting one bit/sense line in each of the memory segments, a second plurality of transmission gate systems, each having first and second gates, with each of the gates being coupled to a different one of the second plurality of decoders, and means for selectively activating the first and second gates of each of the second plurality of transmission gate systems.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
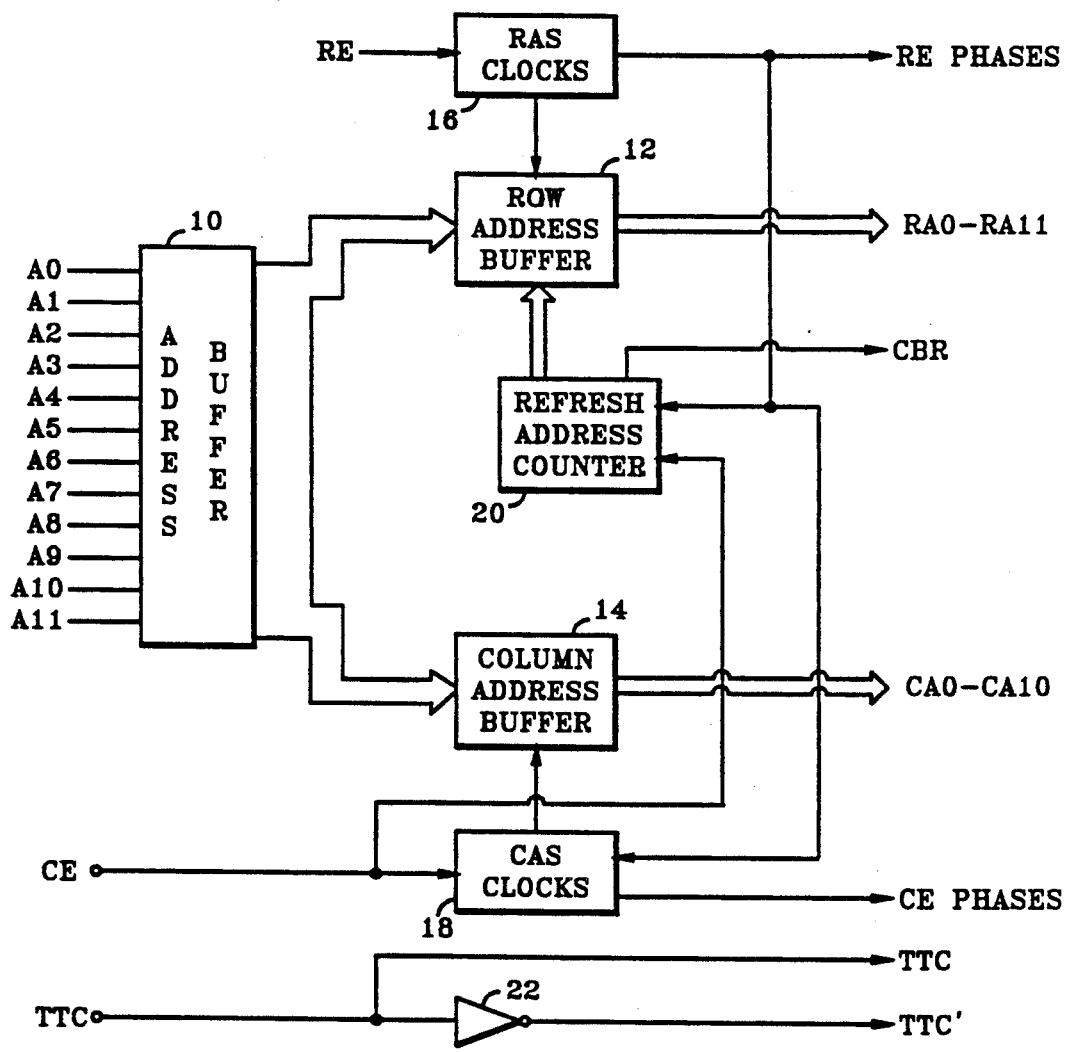
FIG. 1 is a diagram primarily in block form indicating circuits for producing addressing and control signals used in the operation of a large memory in accordance with the teachings of this invention.
Figure 2:
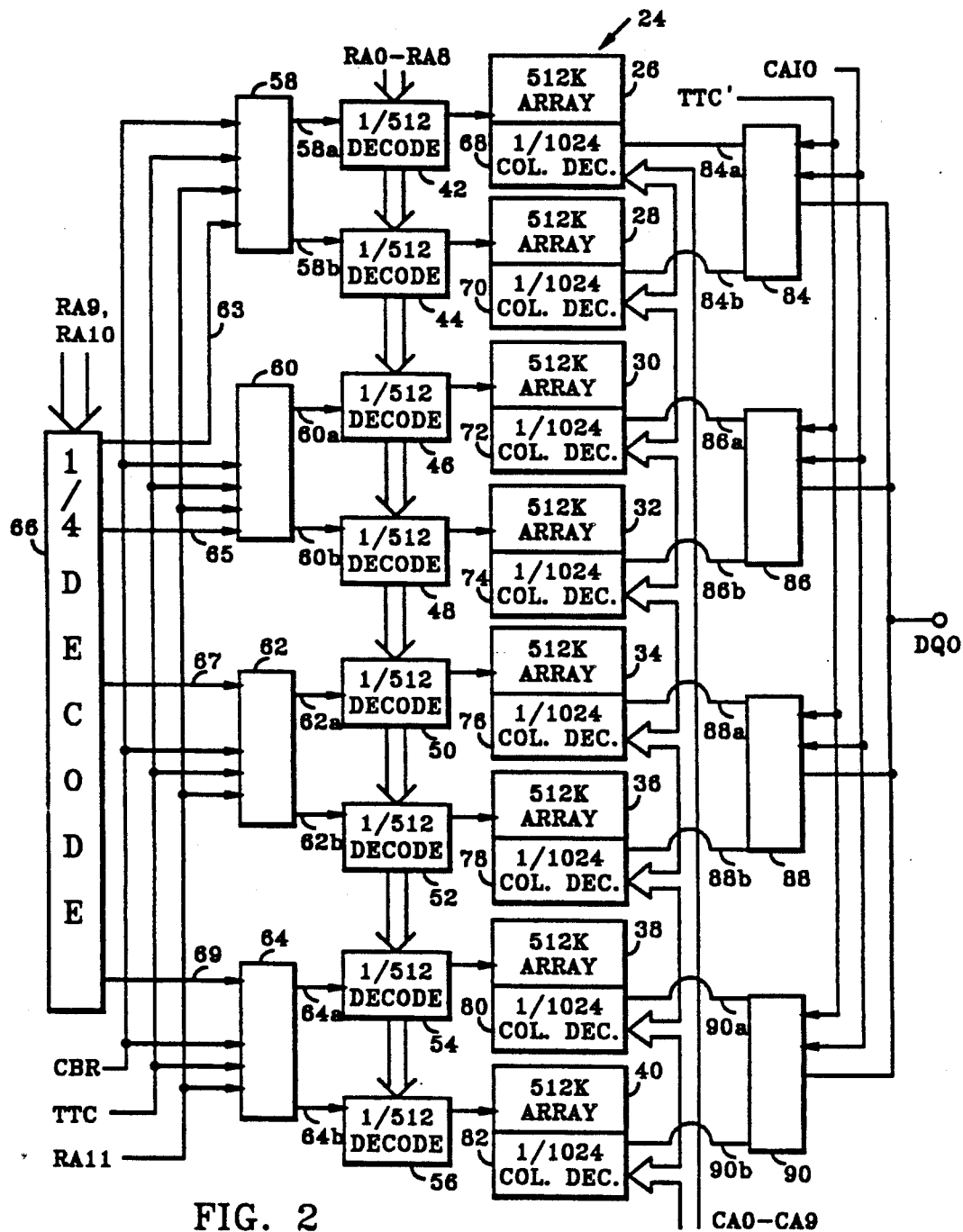
FIG. 2 is a diagram primarily in block form indicating a large memory with decoding circuits to which are applied the signals from the circuits of FIG. 1.

Referring to FIGS. 1 and 2 of the drawings in more detail, there is illustrated in FIG. 1 in block diagram form circuits for providing pulses necessary to operate a large dynamic random access memory illustrated also in block diagram in FIG. 2 of the drawings. In FIG. 1 twelve address lines A0 to A11 are shown connected to inputs of an address buffer 10 with the output of the address buffer 10 connected to a row address buffer 12 and to a column address buffer 14. Outputs from the row address buffer 12 include twelve row address lines RA0 to RA11 and outputs from the column address buffer 14 include eleven column address lines CA0 to CA10.

A row enable terminal RE is connected to the input of row address strobe (RAS) clocks 16 which has one output connected to the row address buffer 12 and other outputs for row enable (RE) phases which are generally used as timing pulses in memory arrays, decode circuits, sense amplifiers, etc. A column enable terminal CE is connected to the input of column address strobe (CAS) clocks 18 which has one output connected to the column address buffer 14 and another output for column enable (CE) phases which are also used as timing pulses in memory arrays, decode circuits, sense amplifiers, etc. A refresh address counter 20 has a first input connected from the row enable (RE) phases output of the RAS clocks 16 and a second input from the column enable (CE) terminal, with outputs connected to an input of the row address buffer 12. The refresh address counter 20 also has an output identified by CBR, which indicates column before row refresh pulses which will be described in more detail hereinbelow. Further shown in FIG. 1 is a control voltage terminal TTC having either a high or low voltage for controlling 11/11 addresses or 12/10 addresses in appropriate memory chips or modules of a memory system. The control terminal TTC is connected to the input of an inverter 22 having an inverted output TTC'.

FIG. 2 illustrates a nominal four megabit memory 24 which can be one quarter of a sixteen megabit memory chip. The four megabit or four megacell memory 24 includes eight memory arrays 26, 28, 30, 32, 34, 36, 38 and 40, each having 524,288 or 512k memory cells with 512 word lines arranged horizontally and 1024 bit or bit/sense lines arranged vertically, as is well known. Also shown in FIG. 2 are eight one out of 512 or 1/512 decode circuits 42, 44, 46, 48, 50, 54 and 56 which have outputs coupled to respective 512k arrays 26, 28, 30, 32, 34, 36, 38 and 40. Each of the 1/512 decode circuits is designed to select one of the 512 word lines of its respective 512k array. Row addresses RA0 to RA8 from the row address buffer 12 of FIG. 1 are applied to the inputs of each of the 1/512 decode circuits. A first plurality of transmission gate systems is indicated at blocks 58, 60, 62 and 64 with each transmission gate system having four inputs and two outputs, with the systems being similar to each other. A first output 58a from the transmission gate system 58 is connected to an input of the 1/512 decode circuit 42, with a second output 58b being connected to the 1/512 decode circuit 44, a first output 60a from the transmission gate system 60 is connected to an input of the 1/512 decode circuit 46, with a second output 60b being connected to the 1/512 decode circuit 48, a first output 62a from the transmission gate system 62 is connected to an input of the 1/512 decode circuit 50, with a second output 62b being connected to the 1/512 decode circuit 52, and a first output 64a from the transmission gate system 64 is connected to an input of the 1/512 decode circuit 54, with a second output 64b being connected to the 1/512 decode circuit 56.

Each of the transmission gate systems 58, 60, 62 and 64 has three inputs connected to respective terminals CBR, TTC and RA11 shown in FIG. 1 of the drawings. The fourth input to each of the transmission gate systems 58, 60, 62 and 64 is connected to a different output of a one out of four or ¼ decode circuit 66 having inputs connected to the row address buffer 12 of FIG. 1 by row address lines RA9 and RA10. The outputs of the ¼ decode circuit 66 are identified by lines 63, 65, 67 and 69, with line 63 being connected to the transmission gate system 58, line 65 being connected to the transmission gate system 60, the line 67 being connected to the transmission gate system 62 and line 69 being connected to the transmission gate system 64.

Eight one out of 1024 or 1/1024 column decode circuits 68, 70, 72, 74, 76, 78, 80 and 82 are coupled to respective ones of the 512k arrays 26, 28, 30, 32, 34, 36, 38 and 40 and arranged, as is known, to select one of the 1024 bit lines of each of the 512k arrays. Each of the 1/1024 column decode circuits 68, 70, 72, 74, 76, 78, 80 and 82 has the column address lines CA0 to CA9 connected to its input. A second plurality of transmission gate systems is indicated at 84, 86, 88 and 90 with each of these transmission gate systems having four inputs and an output, with each system of the second plurality of transmission gate systems being similar to each other.

The first and second inputs of each of the transmission gate systems 84, 86, 88 and 90 are connected to the column address line CA10 of the column address buffer 14 and to the 12/10 control line TTC' of the inverter 22 of FIG. 1, respectively. Third and fourth inputs 84a and 84b of the transmission gate system 84 are coupled to a selected bit line of the 512k array 26 through the 1/1024 column decode circuit 68 and of the 512k array 28 through the 1/1024 column decode circuit 70, respectively, third and fourth inputs 86a and 86b of the transmission gate system 86 are coupled to a selected bit line of the 512k array 30 through the 1/1024 column decode circuit 72 and of the 512k array 32 through the 1/1024 column decode circuit 74, respectively, third and fourth inputs 88a and 88b of the transmission gate system 88 are coupled to a selected bit line of the 512k array 34 through the 1/1024 column decode circuit 76 and of the 512k array 36 through the 1/1024 column decode circuit 78, respectively, and third and fourth inputs 90a and 90b of the transmission of the 512k array 38 through the 1/1024 column decode circuit 80 and of the 512k array 40 through the 1/1024 column decode circuit 82, respectively. The output of each of the transmission gate systems of the second group of transmission gate systems 84, 86, 88 and 90 is connected to an output terminal DQ0 after passing through, e.g., an off-chip driver circuit (not shown). It should be noted that the terminal DQ0 can also serve as an input terminal.

Figure 3:
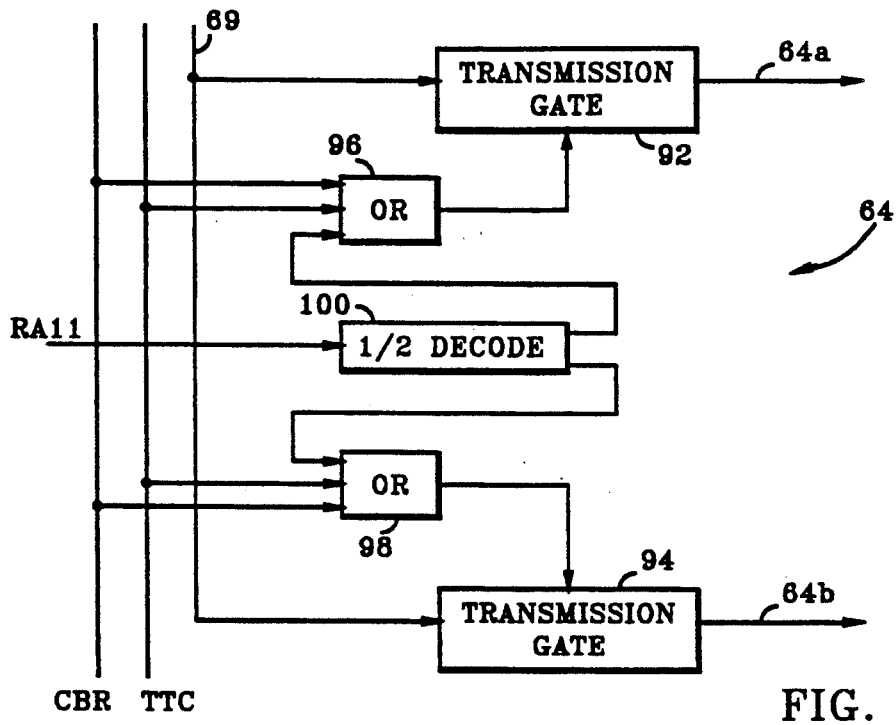
FIG. 3 is a diagram primarily in block form showing more details of one of the control circuits for selecting a row in an array of the large memory of FIG. 2.

In FIG. 3 of the drawings there is shown a more detailed diagram in block form of one of the transmission gate systems 64 of the first group of transmission gate systems illustrated in FIG. 2. The transmission gate system 64 includes first and second transmission gates 92 and 94, respectively, first and second OR gates 96 and 98, respectively, and a one out of two or ½ decode circuit 100. Both the output CBR from the refresh address counter 20 and the control pulse terminal TTC shown in FIG. 1 are connected to each of the first and second OR gates so as to selectively activate these gates. The row address RA11 from the row address buffer 12 of FIG. 1 is connected to an input of the ½ decode circuit 100 with a first output from the ½ decode circuit 100 being connected to an input of the first OR gate 96 and a second output from the ½ decode circuit 100 being connected to an input of the second OR gate 98. An output from the first OR gate 96 is connected to the first transmission gate 92 so as to selectively activate gate 92, and an output from the second OR gate 98 is connected to the second transmission gate 94 so as to selectively activate gate 94. The output line 69 from the ¼ decode circuit 66 of FIG. 2 is connected to the input of the first transmission gate 92 and to the input of the second transmission gate 94. The output from the first transmission gate 92 is connected to the first output 64a of the transmission gate system 64 and the output from the second transmission gate 94 is connected to the second output 64b of the transmission gate system 64.

Figure 4:
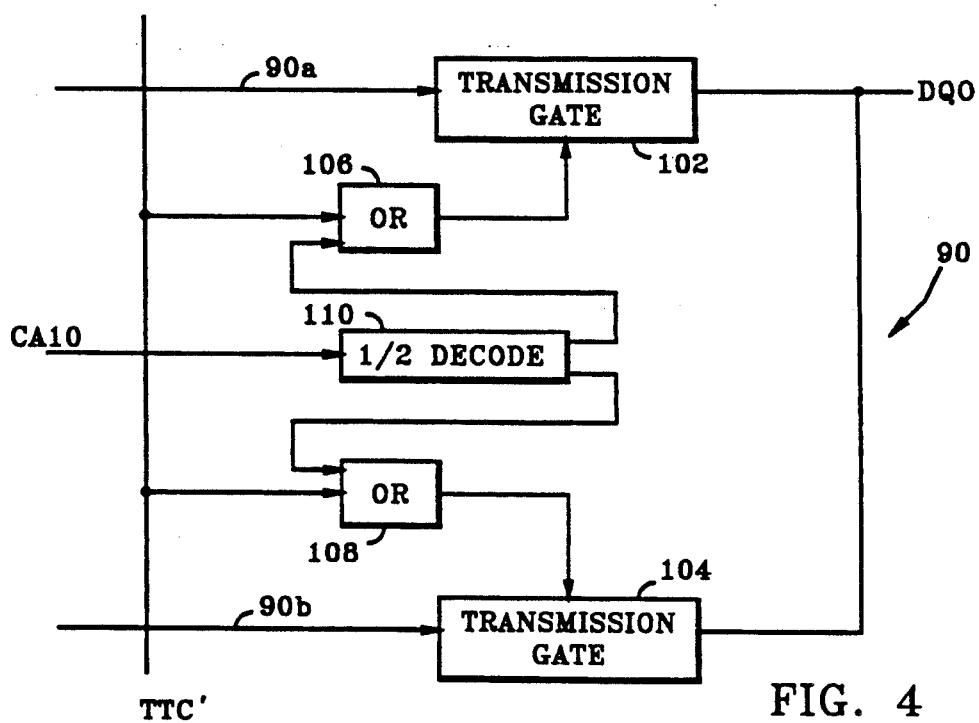
FIG. 4 is a diagram primarily in block form showing more details of one of the control circuits for selecting a column in an array of the large memory of FIG. 2.

In FIG. 4 of the drawings there is shown a more detailed diagram in block form of one of the transmission gate systems 90 of the second group of transmission gate systems 84, 86, 88 and 90 illustrated in FIG. 2. The transmission gate system 90 includes first and second transmission gates 102 and 104, respectively, first and second OR gates 106 and 108, respectively, and a one out of two or ½ decode circuit 110. The output TTC' from the inverter 22 shown in FIG. 1 is connected to each of the first and second OR gates 106 and 108 so as to selectively activate these OR gates. The column address CA10 from the column address buffer 14 shown in FIG. 1 is connected to an input of the ½ decode circuit 110 with a first output of the ½ decode circuit 110 being connected to an input of the first OR gate 106 and a second output of the ½ decode circuit 110 being connected to an input of the second OR gate 108. An output from the first OR gate 106 is connected to the first transmission gate 102 so as to selectively activate the gate 102, and an output from the second OR gate 108 is connected to the second transmission gate 104 so as to selectively activate the gate 104. The third input line 90a of the transmission gate system 90 is connected to an input of the transmission gate 102 and the fourth input line 90b of the transmission gate system 90 is connected to an input of the transmission gate 104. The output from each of the first and second transmission gates 102 and 104 is connected to the output terminal DQ0, which, as stated hereinabove, can also be an input terminal.

The operation of the circuits illustrated in FIGS. 1, 2, 3 and 4 of the drawings will first be described in connection with the 11/11 addressing technique, i.e., when a memory on a chip is arranged to respond to eleven addresses during the row enable (RE) time and eleven addresses during the column enable (CE) time, and then the circuits will be described in connection with the 12/10 addressing technique, i.e., when a memory on a chip is arranged to respond to twelve addresses during the row enable (RE) time and ten addresses during the column enable (CE) time.

Figure 5:
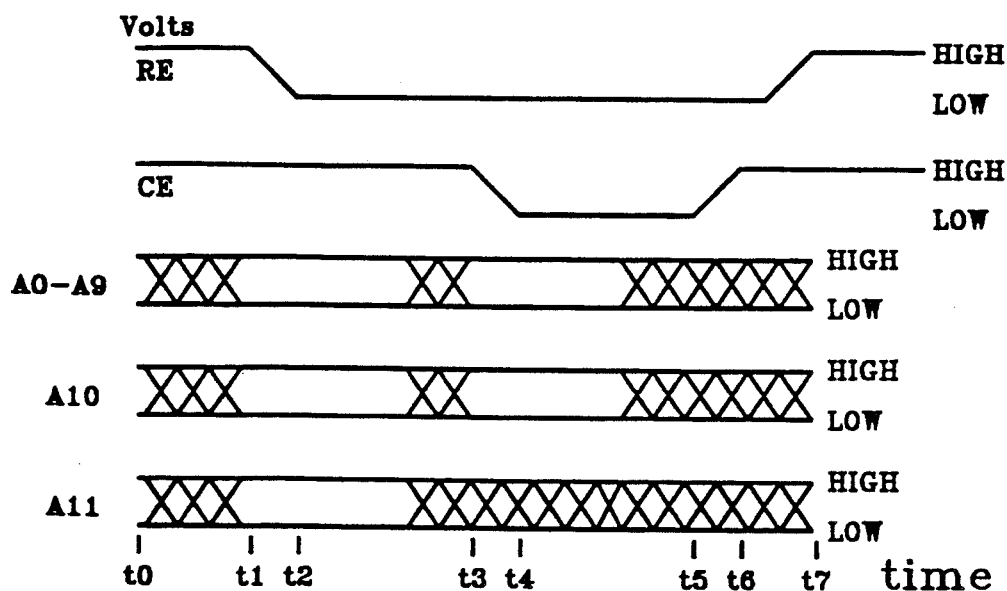
FIG. 5 is a pulse program indicating the pulsing arrangement when the row enable (RE) pulse is applied before the column enable (CE) pulse is applied in the operation of the large memory illustrated in FIG. 2.

In the operation of the circuits of FIGS. 1, 2, 3 and 4 of the drawings when using the conventional 11/11 addressing technique wherein a single cell is to be selected in the large memory 24 of FIG. 2, which may be one quadrant of a memory chip, the voltage on the terminal TTC is set to a high value, such as +3.5 to +5.0 volts, by connecting or wire bonding the terminal TTC to any point of constant high potential on the chip. As indicated in the pulse program in FIG. 5 of the drawings, at row enable (RE) time, i.e., from time t1 to time t2 or when the RE voltage goes from a high value to a low value, e.g., to zero volts, the twelve addresses A0 to A11 applied to the chip and indicated in FIG. 1 of the drawings are buffered in the address buffer 10 connected to the row address buffer 12 which provides at the output thereof twelve row addresses RA0 to RA11. In the graph of FIG. 5, and also in FIG. 6, it should be understood that the areas shown by a series of Xs represent voltages at times, such as between times t0 and t1, which are unimportant to the operation of the circuits or systems of the invention.

These areas are commonly called "don't care voltages". The row addresses RA9 and RA10 are applied to the ¼ decode circuit 66 of FIG. 2 to select one of the four outputs 63, 65, 67 and 69. The selected output, e.g., output 69, has preferably a high voltage which is applied to the transmission gate system 64 and more particularly to the inputs of the first and second transmission gates 92 and 94 shown in FIG. 3 of the drawings. Since the voltage on terminal TTC is high and applied to both of the OR circuits 96 and 98, the output of the OR circuits 96 and 98 activates or turns on both of the transmission gates 92 and 94. With the transmission gates 92 and 94 open, the high voltage on the output line 69 passes through to the outputs 64a and 64b of the transmission gates 92 and 94, respectively. The high voltage on outputs 64a and 64b activates both of the 1/512 decode circuits 54 and 56 and consequently both of the 512k arrays 38 and 40, with the row addresses RA0 to RA8 applied to the 1/512 decode circuits selecting one of the 512 word lines in each of the 512k arrays 38 and 40.

At column enable (CE) time, i.e., after time t3 or when the CE voltage goes from a high value to a low value, as indicated in FIG. 5 of the drawings, the twelve addresses A0 through A11 presented to the chip are buffered in the address buffer 10 connected to the column address buffer 14 of FIG. 1 which provides at the output thereof only eleven column addresses CA0 through CA10, with address A11 at RE time being address CA10 at CE time. The column addresses CA0 to CA9 are applied to the 1/1024 column decode circuits 68, 70, 72, 74, 76, 78, 80 and 82 to select 1 out of the 1024 bit/sense lines in the activated arrays, i.e., arrays 38 and 40. The column address CA10 is applied to transmission gate systems 84, 86, 88 and 90 to select one out of the two outputs from the two selected arrays, i.e., the output 90a from array 38 or output 90b from array 40. This one of two select operation in the transmission gate system 90 can better be understood by referring to FIG. 4 of the drawings. As shown in FIG. 4, since the voltage at the terminal TTC has been set to a high value, the voltage on TTC' which is at the output of the inverter 22 shown in FIG. 1 of the drawings, is at a low voltage, thus, the voltage at the outputs of the OR gates 106 and 108 does not activate or turn on the transmission gates 102 and 104. However, depending on the address, the voltage of the column address CA10 is either high or low, which applies an activating voltage to either OR gate 106 or to OR gate 108 to turn on transmission gate 102 or transmission gate 104, respectively. Accordingly, assuming that the transmission gate 102 is selected, a voltage representative of the selected cell in the 512k array 38 of the large memory 24 is applied to the output terminal DQ0 through the output 90a. It should be understood that the terminal DQ0 is used as a data input terminal during a write operation, as well as a data output terminal.

In the operation of the circuits shown in FIGS. 1, 2, 3 and 4 of the drawings when using the 12/10 addressing technique wherein a single cell is to be selected in the large memory 24 of FIG. 2, the voltage on the terminal TTC is set to a low value, such as zero volts, or even to a negative value, by connecting or wire bonding the terminal TTC to any point of constant low potential on this particular memory chip. As indicated in the pulse program in FIG. 5 of the drawings, at row enable (RE) time the twelve addresses A0 to A11 applied to the chip and indicated in FIG. 1 of the drawings are buffered in the address buffer 10 connected to the row address buffer 12 which provides at the output twelve row addresses RA0 to RA11. As stated hereinabove in connection with the 11/11 addressing technique, the row addresses RA9 and RA10 are applied to the ¼ decode circuit 66 of FIG. 2 to select one of the four outputs 63, 65, 67 and 69. The selected output, e.g., again output 69, has a high voltage which is applied to the transmission gate system 64 and more particularly to the inputs of the first and second transmission gates 92 and 94 shown in FIG. 3 of the drawings. Since the voltage on the terminal TTC is low and applied to both of the OR circuits 96 and 98, the outputs of the OR circuits 96 and 98, which are also low, do not activate either of the transmission gates 92 and 94. Likewise, the operation is taking place in the memory 24. However, since row address RA11 is applied to the input of the ½ decode circuit 100, one of the two OR gates 96 and 98 will turn on or open its respective transmission gate 92 and 94.

Assuming that a high voltage is developed at the output of the first OR gate 96, the first transmission gate 92 will provide a high voltage on the output 64a to activate the 1/512 decode circuit 54 and consequently the 512k array 38, with the row addresses RA0 to RA8 applied to the 1/512 decode circuits selecting one of the 512 word lines in the 512k array 38. It can be seen that since the address RA11 applied to the ½ decode circuit 100 did not select the second OR gate 98, the transmission gate 94 was not activated and, therefore, the 1/512 decode circuit 56 was not activated. Accordingly, only one word line in only one 512k array of the entire memory 24 has been selected by using all twelve of the row addresses RA0 to RA11 from the row address buffer 12 of FIG. 1.

When using the 12/10 technique, at column enable (CE) time as indicated in FIG. 5 of the drawings, the twelve addresses A0 to A11 presented to the chip are also buffered in the address buffer 10 connected to the column address buffer 14 of FIG. 1 which provides at the output thereof only eleven column addresses CA0 through CA10. The column addresses CA0 to CA9 are applied to the 1/1024 column decode circuits 68, 70, 72, 74, 76, 78, 80 and 82 to select 1 out of the 1024 bit/sense lines in the activated array, i.e., array 38. Although the column address CA10 is also applied to the second group of transmission gate systems 84, 86, 88 and 90 when using the 12/10 addressing technique, column address CA10 has no effect on these transmission gate systems since the terminal TTC' is at a high voltage. This can be more clearly understood by referring to FIG. 4 of the drawings wherein the terminal TTC' having a high voltage is connected to both of the OR gates 106 and 108 to activate both transmission gates 102 and 104. Since only the 512 array 38 has been activated, data from the selected cell in array 38 passes through the output 90a through the transmission gate 102 to the output terminal DQ0.

Figure 6:
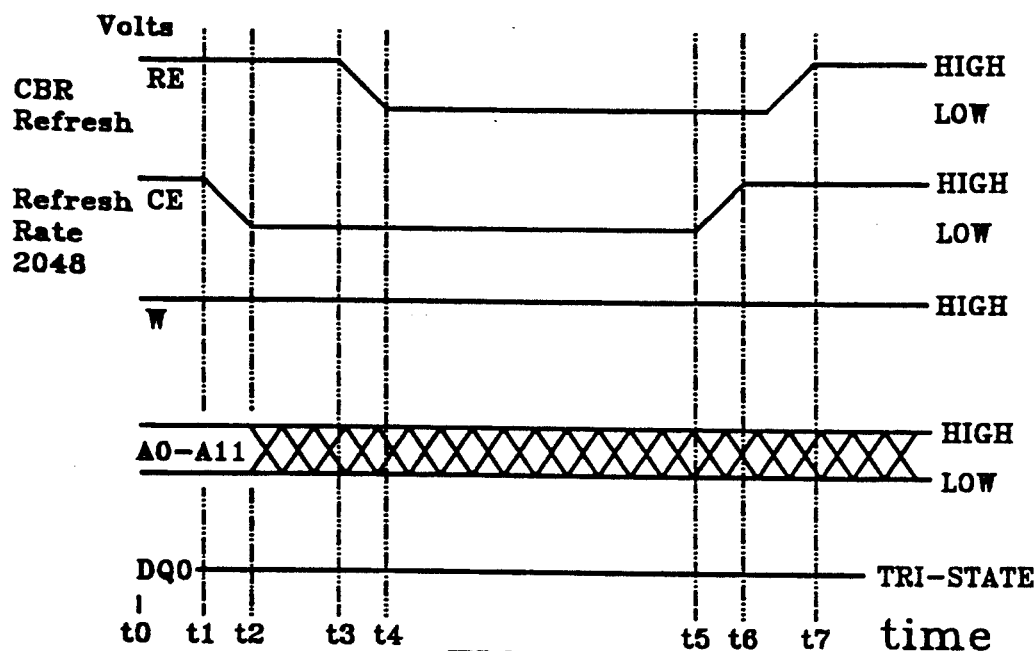
FIG. 6 is a pulse program indicating the pulsing arrangement when the column enable (CE) pulse is applied before the row enable (RE) pulse is applied in the operation of the large memory illustrated in FIG. 2 for cell refresh purposes.

In the use of either technique, i.e., the 11/11 multiplexed address or the 12/10 multiplexed address mode of operation, the use of a CAS before RAS (CBR) pulse from an output of the refresh address counter 20 as indicated in FIG. 1 and also in the pulse program of FIG. 6 of the drawings, the CBR pulse produces the same results. If the column enable (CE) voltage is active, between times t1 and t2, before the row enable (RE) voltage, between times t3 and t4, the refresh address counter 20 supplies a CBR pulse and the addresses RA0 through RA10 to the row address buffer 12. In a CE before RE refresh operation the CE voltage timings are not required and do not operate. Therefore, the column addresses CA0 through CA10 are not required. It can be seen that in FIG. 3 of the drawings a high voltage on the line CBR activates both OR gates 96 and 98 independently of the voltage on the twelve ten control line TTC. Accordingly, both OR gates 96 and 98 apply a high voltage to their respective transmission gates 92 and 94 selecting the two 1/512 decode circuits 54 and 56 as well as the two 512k arrays 38 and 40 and, thus, one word line in each of these two 512k arrays 38 and 40. Accordingly, each of the cells associated with these two word lines is refreshed from the row addresses RA0 through RA10 which are internally supplied. As also indicated in FIG. 6 of the drawings, during a refresh operation the write select voltage W is high and the output DQ0 is in tri-state.

It should be noted that the use of the 12/10 addressing technique requires that only ½ of the chip be powered up which saves active power without impacting either density or performance. However, the use of the 12/10 addressing as such requires a memory cell refresh rate of 4,000 cycles instead of the usual 2,000 cycles when using the 11/11 addressing technique which causes an increase in refresh power to maintain the contents stored in the memory cells valid. The typical power difference between a ¼ array select and a ⅛ array select chip design at 16 million cells or megabits is generally about 150 milliwatts, with a ⅛ array select yielding approximately 350 milliwatts as compared to a ¼ array select yielding approximately 500 milliwatts. Thus, the active power yield for a 12/10 addressed chip is about 0.7 of the active power yield for a 11/11 addressed chip.

The maximum refresh interval of a dynamic random access memory is technology limited. Thus, if this limit is 32 milliseconds and 2,000 refresh cycles are required, then the average time required between refreshes is 32/2048 or 15.7 microseconds and, with a chip cycle of 100 nanoseconds, there is a memory availability of 15.6/15.7 or about 99.3%. At 4,000 refresh cycles the average time between refreshes becomes 7.85 microseconds and the availability becomes about 98.7%. The power to keep the memory contents valid then is as follows:

Keep alive power (KAP) =

$$\frac{\text{Power Active Cycle (PAC)} \times \text{No. of Cycles (NC)}}{\text{Refresh Time (RT)}}.$$

Thus, $$KAP_{11/11} = \frac{(PAC_{11/11})(2048)}{RT} \quad (1)$$

and $$PAC_{11/11} = \frac{(KAP_{11/11})(RT)}{2048}. \quad (2)$$

also, $$KAP_{12/10} = \frac{(PAC_{12/10})(4096)}{RT}. \quad (3)$$

so substituting $PAC_{12/10}$ with $0.7\ PAC_{11/11}$ yields $$KAP_{12/10} = \frac{(0.7\ PAC_{11/11})(4096)}{RT}, \text{ and} \quad (4)$$

substituting $PAC_{11/11}$ from equation (2) into equation (4) yields $$KAP_{12/10} = 1.4\ (KAP_{11/11})$$

wherein
$KAP_{11/11}$ = Keep Alive Power for 11/11 multiplexed addressing,
$KAP_{12/10}$ = Keep Alive Power for 12/10 multiplexed addressing,
$PAC_{11/11}$ = Power Active Cycle for 11/11 multiplexed addressing,
$PAC_{12/10}$ = Power Active Cycle for 12/10 multiplexed addressing ($0.7\ PAC_{11/11}$),
$NC_{11/11}$ = 2048 cycles,
$NC_{12/10}$ = 4096 cycles, and
RT = refresh interval, which is technology defined.

What has been described hereinabove is that a 12/10 multiplexed address chip requires 1.4 times more power to maintain memory contents valid than does a 11/11 multiplexed address chip. The single cycle active power of a 12/10 multiplexed addressed chip is only 0.7 the power of an 11/11 multiplexed addressed chip. The availability of a 12/10 multiplexed addressed chip is less than that of an 11/11 multiplexed addressed chip. Also, with the use of the terminal TTC and the on board refresh address counter 20 controlled by a column enable (CE) pulse before a row enable (RE) pulse supplying for refresh the voltage CBR, there is provided a 2,000 cycle refresh for a chip with 11/11 multiplexed addressing with a 2,000 cycle row enable (RE) only refresh or a 2,000 cycle column address before row address (CBR) refresh and for a chip with a 12/10 multiplexed addressing with a 4,000 cycle row enable (RE) only refresh or with a 2,000 cycle column address before row address (CBR) refresh.

Figure 8:
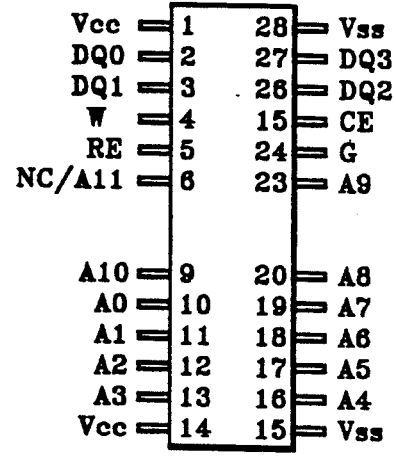
FIG. 8 illustrates the exterior of a memory module indicating the terminals or pins to which the signals used in the present invention are applied.

It should be understood that the circuit illustrated in FIG. 1 of the drawing is required only once on a chip, however, if desired this circuit may be repeated in part or in its entirety for enhancing yield, reliability or performance. It should also be understood that the output DQ0 is an input/output terminal for the one quadrant illustrated particularly in FIG. 2 of the drawings and that each of the other three quadrants have an input/output terminal which may be identified as DQ1, DQ2 and DQ3 and which are indicated in FIG. 8 of the drawings. As is known, four bits of information are simultaneously written into the four quadrants of memory by applying appropriate voltages to the input/output terminals DQ0, DQ1, DQ2 and DQ3 and four bits of information are simultaneously read out of the four quadrants at the terminals DQ0, DQ1, DQ2 and DQ3 during a read cycle.

Figure 7:
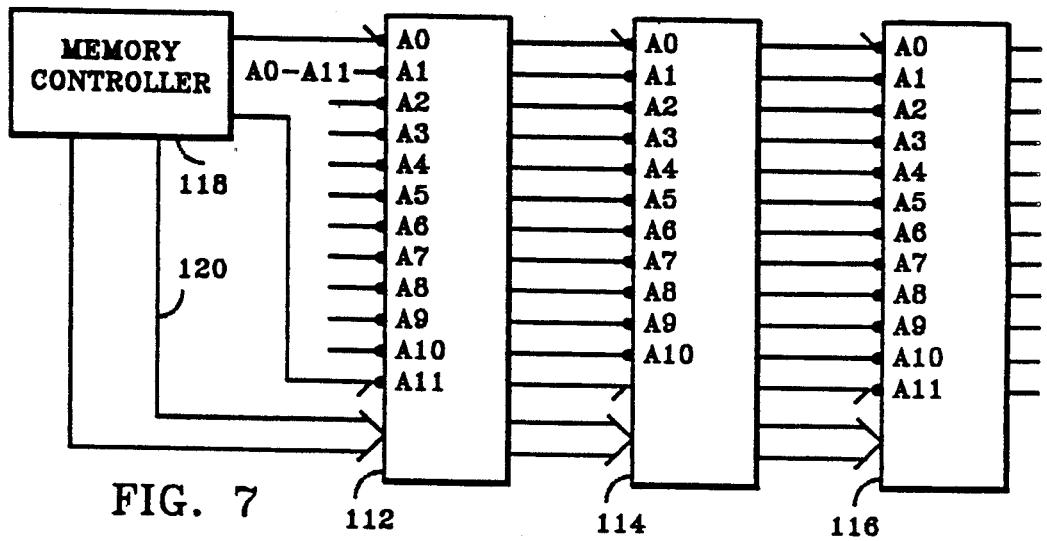
FIG. 7 illustrates a plurality of memory chips or modules to which address lines and control lines are connected from a memory controller in accordance with the teachings of the present invention.

Having 16 megabit, i.e., 4 megabit by 4, memory chips that are either 12/10 or 11/11 multiplexed addressed, normally would require them to be used on different memory busses with different memory controllers. Referring again to the timing chart of FIG. 5 and to FIG. 7 of the drawings, it can be seen that both the 12/10 and 11/11 addressing can be used concurrently, on the same memory buss with the same or common memory controller. The twelve addresses A0 to A11 are sent at the row enable (RE) time. If the chip is an 11/11 addressed chip, the addresses A0 to A10 are used and if the chip is a 12/10 addressed chip, the addresses A0 to A11 are used. At column enable (CE) time, the same address on address A11 at RE time is also retransmitted on address A10 so as to address the same location in each of the chips in a memory system or card. Now the 11/11 addressed chip uses inputs A0 to A10 and gets the same total 22 addresses as the 12/10 addressed chip. The 12/10 addressed chip uses only addresses A0 to A9 at the CE time. Address integrity to the two chips is maintained. As discussed hereinabove, the system can maintain a low refresh power and high availability with mixed chips on the memory buss by using the CBR voltage refresh technique at 2,000 cycles, but an RE only refresh is still available by cycling at 4,000 cycles during the refresh interval and supplying the proper addresses A0 to A11. By designing the chip such that the appropriate biasing of the TTC terminal allows the chip to operate as an 11/11 or 12/10 addressed chip provides a customer the ability to use the design as best fits his application considering low refresh power, low active power, availability desired, system migratability, etc. As shown in FIG. 7, memory chips 112, 114 and 116 receive their addresses from a memory controller 118 along common address lines A0 to A11 except that address line A11 is not connected to the memory chip 114 since it is operated by the 11/11 multiplexed addresses, whereas the memory chips 112 and 116 are operated by the 12/10 multiplexed addresses. The outputs 120 from the memory controller 118 provide controls for timing and chip selection, as is known. The packaged unit could provide either the extra two inputs A11 and TTC for card programming by card wiring or the same lead frame could be used with a simple two wire bond change, one to bias TTC and one to connect the address A11 to provide industry standard X4 pinouts.

An industry type package is indicated in FIG. 8 of the drawings having 24 terminals or pins, with locations 7, 8, 21 and 22 not being provided normally with terminals or pins. In FIG. 8, the Vcc pin is for the positive voltage supply, Vss is the low voltage or ground, DQ0, DQ1, DQ2 and DQ3 are the inputs/output terminals of the respective four quadrants of the memory, W is the write/read control, G is an output enable voltage and NC is generally a no connect or not used pin.

Figure 9:
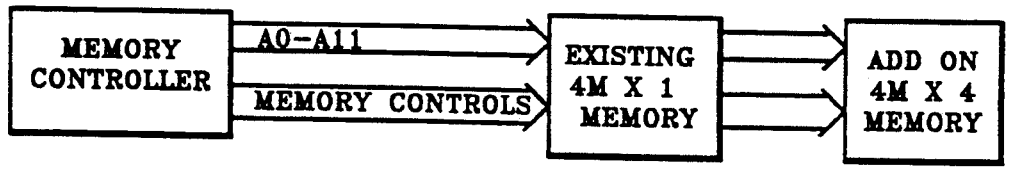
FIG. 9 illustrates an arrangement of a large add on memory of the present invention to an existing memory system.

In regard to migratability, FIG. 9 indicates how a 16 megabit memory chip using the 12/10 addressing technique can be added to an existing memory system, using the 11/11 addressing technique, essentially by merely adding a memory chip arranged in accordance with the design of the present invention and adding a twelfth address from the memory controller.

Accordingly, it can be seen that the present invention provides a memory system with optimum addressing for any particular application including the use of 11/11 or 12/10 addressing, column enable (CE) before row enable (RE) refreshing at 2,000 cycles, RE only refreshing for 11/11 addressing or 4,000 cycle refreshing for 12/10 addressing, with card wiring to support either the 11/11 or 12/10 addressing depending on part availability and mixing both 11/11 and 12/10 addressing on the same card or system.

While the invention has been particularly shown and described with reference to preferred embodiments thereof, it will be understood by those skilled in the art that various changes in form and details may be made therein without departing from the spirit and scope of the invention. For example, while the invention has been discussed with reference to 12/10 and 11/11 addressing, the concepts embodying the invention can be applied to 13/11 and 12/12 addressing, 14/10 and 12/12 addressing, etc.

What is claimed is:

1. A memory system comprising
   a given number of memory segments, each having word and bit/sense lines,
   a first plurality of decode means coupled to said given number of memory segments for selecting one word line in each of said memory segments,
   a first plurality of transmission gate systems, each having first and second transmission gates, with each of said gates being coupled to an input to a different one of said decode means,
   a second decode means having a first plurality of outputs, each of said outputs being coupled to a respective one of said transmission gate systems,
   first means for selectively activating said first and second gates in each of said first plurality of transmission gate systems,
   a third plurality of decode means coupled to said given number of memory segments for selecting one bit/sense line in each of said memory segments,
   a second plurality of transmission gate systems, each having first and second transmission gates, with each of said gates of said second plurality of transmission gate systems being coupled to a different one of said third plurality of decode means, and
   means for selectively activating said first and second transmission gates of each of said second plurality of transmission gate systems.

2. A memory system as set forth in claim 1 wherein each of said transmission gate systems further includes a one out of two decode circuit having a first output coupled to the first transmission gate and a second output coupled to the second transmission gate of its corresponding transmission gate system.

3. A memory system as set forth in claim 2 wherein each of said transmission gate systems further includes first and second OR gates, the first output of said one out of two decode circuit being coupled to said first transmission gate through said first OR gate and the second output of the one out of two decode circuit being coupled to said second transmission gate through said second OR gate.

4. A memory system as set forth in claim 3 wherein said first and second means include means for applying memory address pulses to inputs of said one out of two decode circuits and means for applying fixed voltages to inputs of said OR gates.

5. A memory system as set forth in claim 4 wherein said first means of said first plurality of transmission gate systems further includes means for selectively applying a column enable before a row enable pulse to an input of each of said OR gates.

6. A memory system as set forth in claim 1 wherein said first means includes row address means, a refresh counter and a terminal having a true voltage, and said second means includes column address means and a terminal having a complemented voltage to that of the true voltage.

7. A memory system as set forth in claim 1 wherein each of said first plurality of transmission gate systems further includes first and second OR gates, said first OR gate having an output connected to said first transmission gate and said second OR gate having an output connected to said second transmission gate, and a one out of two decode circuit having a first output connected to an input of said first OR gate and a second output connected to an input of said second OR gate.

8. A memory system as set forth in claim 1 wherein each of said second plurality of transmission gate systems further includes first and second OR gates, said first OR gate having an output connected to said first transmission gate and said second OR gate having an output connected to said second transmission gate, and a one out of two decode circuit having a first output connected to an input of said first OR gate and a second output connected to an input of said second OR gate, the outputs of said first and second transmission gates being connected to a common point.

9. A memory system as set forth in claim 7 wherein each of said second plurality of transmission gate systems further includes first and second OR gates, said first OR gate having an output connected to said first transmission gate and said second OR gate having an output connected to said second transmission gate, and a one out of two decode circuit having a first output connected to an input of said first OR gate and a second output connected to an input of said second OR gate.

10. A memory system as set forth in claim 7 wherein said first means includes means for applying row address pulses to an input of said one out of two decode circuit, means for applying a first fixed voltage to inputs of said OR gates and means for applying signals from a refresh address counter to inputs of said OR gates.

11. A memory system as set forth in claim 10 wherein said second means includes means for applying column address pulses to an input of said one out of two decode circuit and means for applying a second fixed voltage having a magnitude different from that of the first fixed voltage to inputs of said OR gates.

12. A memory system as set forth in claim 11 further including an inverter having an input and an output, the input of said inverter having said first fixed voltage and the output of said inverter having said second fixed voltage.

13. In a memory system having a plurality of memory cells interconnected in a plurality of bit lines and word lines, a plurality of word decoders receiving a first number of address bits for selecting one of said plurality of word lines, and a plurality of bit decoders receiving a second number of address bits for selecting one of said plurality of bit lines, the improvement comprising:

means including a row address buffer and a column address buffer coupled to said decoders, for disabling preselected ones of said word decoders and enabling preselected ones of said bit decoders if an external control signal indicates a first predetermined relationship between X and Y in a given memory system operational cycle, and for disabling preselected one of said bit decoders and enabling preselected one of said word decoders if said external control signal indicates a second predetermined relationship between X and Y in said given memory system operation cycle.

* * * * *